(12) United States Patent
Carney et al.

(10) Patent No.: US 8,390,308 B2
(45) Date of Patent: Mar. 5, 2013

(54) TESTBED FOR TESTING ELECTRONIC CIRCUITS AND COMPONENTS

(75) Inventors: Michael Carney, Waterloo (CA); Marek Reksnis, Waterloo (CA); Ted Toth, Kitchener (CA)

(73) Assignee: Research In Motion Limited, Waterloo (CA)

( * ) Notice: Subject to any disclaimer, the term of this patent is extended or adjusted under 35 U.S.C. 154(b) by 212 days.

(21) Appl. No.: 12/039,854

(22) Filed: Feb. 29, 2008

(65) Prior Publication Data

US 2009/0219045 A1    Sep. 3, 2009

(51) Int. Cl.
    *G01R 31/00*    (2006.01)
(52) U.S. Cl. ............... 324/756.07; 324/756.01
(58) Field of Classification Search .......... None
    See application file for complete search history.

(56) References Cited

U.S. PATENT DOCUMENTS

| | | | | |
|---|---|---|---|---|
| 4,420,877 A * | 12/1983 | McKenzie, Jr. | ............... | 29/739 |
| 4,628,409 A | 12/1986 | Thompson et al. | | |
| 5,068,602 A | 11/1991 | Mielke | | |
| 5,326,937 A * | 7/1994 | Watanabe | ............... | 174/263 |
| 5,420,378 A * | 5/1995 | Estes et al. | ............... | 174/263 |
| 5,600,259 A * | 2/1997 | Bartyzel et al. | ............... | 324/761 |
| 5,736,279 A | 4/1998 | Mott et al. | | |
| 5,823,818 A | 10/1998 | Bell et al. | | |
| 6,265,671 B1 * | 7/2001 | Matsuno | ............... | 174/255 |
| 6,294,922 B1 * | 9/2001 | Okubo et al. | ............... | 324/761 |
| 6,661,245 B1 | 12/2003 | Reis et al. | | |
| 7,478,003 B2 * | 1/2009 | Cowan et al. | ............... | 702/117 |
| 7,554,040 B2 * | 6/2009 | Nakao et al. | ............... | 174/260 |

FOREIGN PATENT DOCUMENTS

EP    0677985 A    10/1995
JP    2007042995 A  *  2/2007

OTHER PUBLICATIONS

Office Action mailed Nov. 7, 2011. In corresponding application No. 2,656,317.

* cited by examiner

*Primary Examiner* — Paresh Patel
(74) *Attorney, Agent, or Firm* — Novak Druce Connolly Bove + Quigg LLP

(57) ABSTRACT

There is disclosed an electronic testbed, an electronic testbed board, and a method for positioning receptacles for nails in the electronic testbed board. In an embodiment, the electronic testbed board includes a mounting through-hole for mounting a receptacle for a nail. The mounting through-hole is drilled to a suitably precise diameter for mounting the receptacle substantially perpendicular to the testbed board. One or more via-holes are located adjacent the mounting through-hole, and are adapted to allow an electrical connection between any conductive layers provided at the one or more via-holes. The receptacle may be mounted more accurately and the electronic test bed may be built more accurately by separating the functions of the via-holes and the mounting through-hole.

8 Claims, 6 Drawing Sheets

US 8,390,308 B2

TESTBED FOR TESTING ELECTRONIC CIRCUITS AND COMPONENTS

COPYRIGHT NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever.

FIELD OF THE INVENTION

The present invention relates generally to a testbed for testing electronic circuits and components.

BACKGROUND

In electronics assembly and manufacturing, a printed circuit board (PCB) is often used to lay down electrical circuits and to provide a base for mounting various types of electronic components. The circuits in the PCBs may comprise electrically conductive pathways traced or etched from conductive material (e.g. copper sheets) onto a non-conductive substrate. Multiple layers of these conductive pathways may be separated by alternating layers of non-conductive substrates in order to form a laminate board that may include many layers of circuits and non-conductive substrates.

In order to connect the circuits in one or more of the conductive layers, via-holes many be drilled into the laminate layers of the PCB. Once the via-hole is formed, the inner walls of the holes are plated with copper or another conductive material such that any overlapping conductive pathways located at the point of the via-hole are electrically connected between layers. The depth of the drilling may be controlled to connect only some of the layers in the PCB, or the via-hole may be drilled through the laminate board to provide an opening from one side of the board to the other.

Components are then placed on the PCB at predetermined connection points provided on the outer surfaces of the PCB in order to build various parts of the circuit required for the designed operation of the electronic device. Generally speaking, electronic components with leads are attached to the PCB at connection points defined by conductive landing pad extensions or connectors provided on the surface of the PCB to receive the component leads. For electronic components that are to be permanently attached to the PCB, the electrical and mechanical connections between the component leads and the conductive landing pad extensions may be made using a suitable soldering paste or compound.

Once a stage of assembly has been completed, an electronic device under test (DUT) may be tested on a testbed to ensure that the electrical connections and pathways have been properly assembled to that point. To ensure a proper test, the testbed must be properly configured.

DETAILED DESCRIPTION

As noted above, the present invention relates to a testbed for testing electronic circuits and components.

Figure 1:
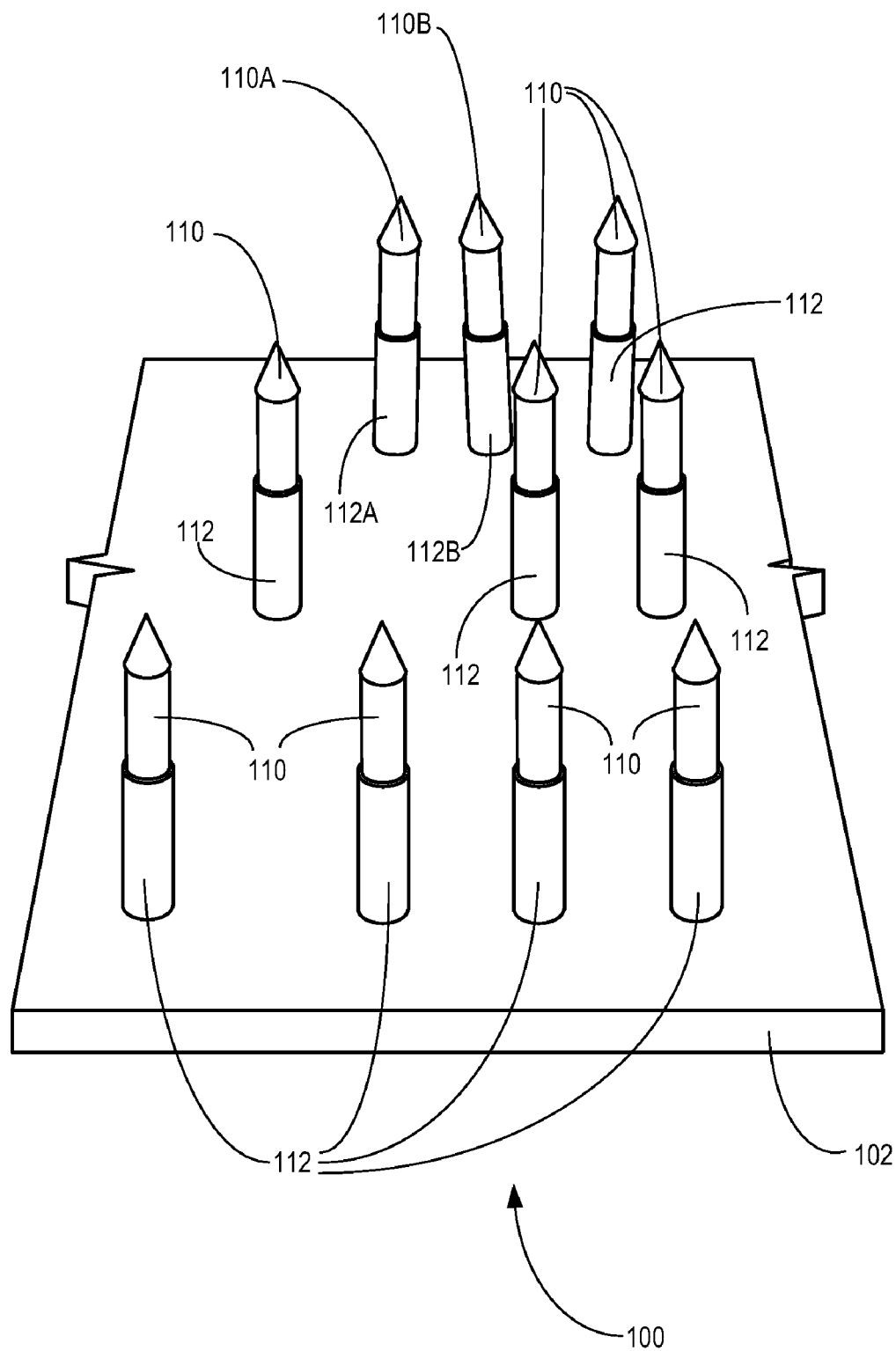
FIG. 1 is a perspective view of a portion of a testbed having a plurality of nails provided thereon.

Referring to FIG. 1, shown is a portion of a testbed platform 100 which may be used to electrically probe a DUT or device under test. As shown, this may be achieved by positioning a plurality of nails 110 at various locations in the testbed board 102. These nails may be positioned at their intended locations by using receptacles 112 mounted and soldered into position in via-holes in the testbed board 102. Each nail 110 may be spring mounted in a receptacle 112 such that the overall height of the nails 110 as measured from the testbed board 102 may be adjusted for making proper contact with the probe points of a DUT.

In order to conduct a proper test, the testbed platform 100 must be properly configured, and the nails 110 must be accurately positioned within the testbed board 102. Heretofore, via-holes have been drilled with a larger diameter than is necessary for the diameter of receptacles 112, and then coated with copper or other conductive materials to provide an electrical connection between layers of the testbed plate 102. The copper or other conductive material is typically applied at the via-holes using a metallic vapour depositing process, and is built up to a suitable thickness to provide both an electrical connection at the via-holes, and a suitable diameter for the receptacles 112. However, due to manufacturing and processing variations, the thickness of the copper or other conductive material built up in the via-holes may vary. The resulting diameter of the copper coated via-holes may thus vary, and the via-holes may sometimes be too large or too small for the diameter of the receptacles 112.

Figure 2A:
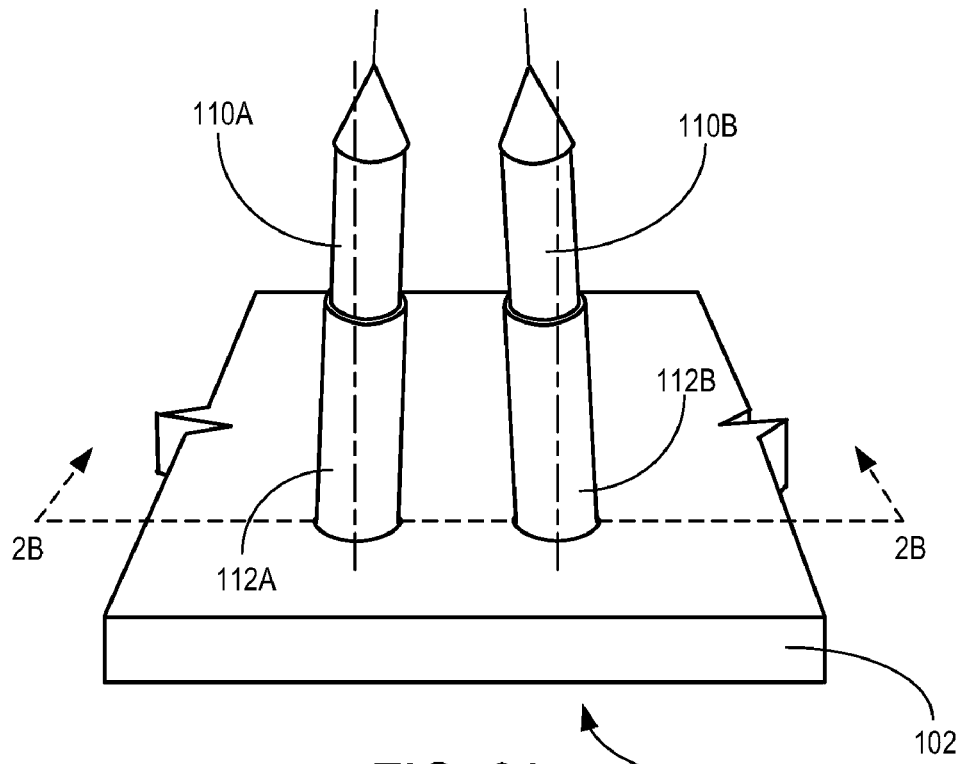
FIG. 2A is an enlarged perspective view of two of the nails that have been positioned incorrectly.
Figure 2B:
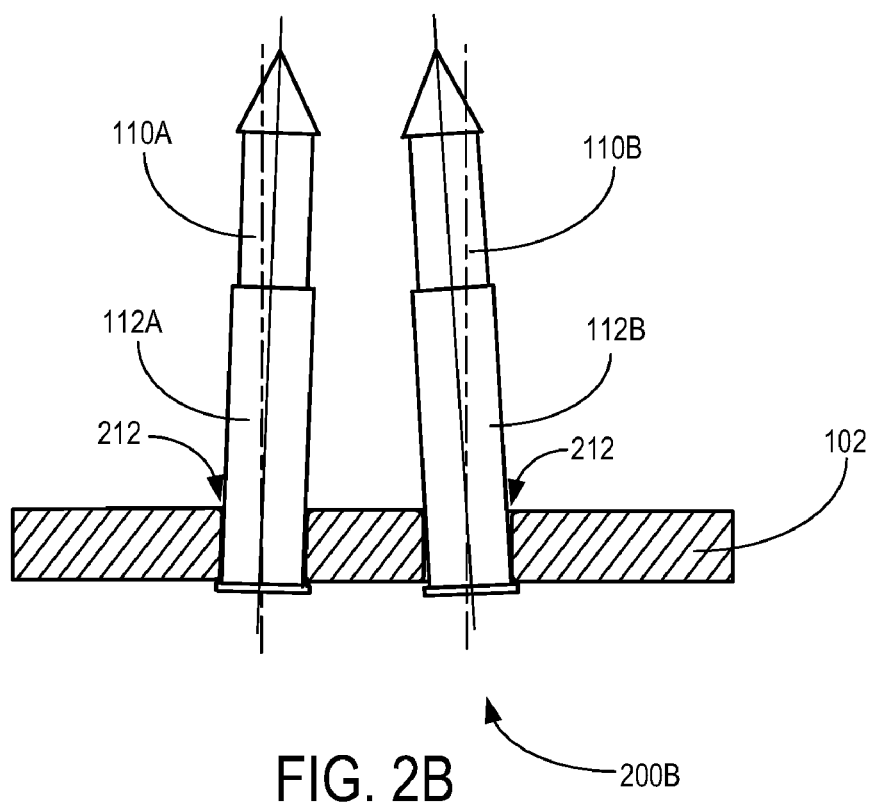
FIG. 2B is a schematic cross-section of the perspective view in FIG. 2A taken at 2B-2B.

Now referring to FIG. 2A and FIG. 2B, shown in FIG. 2A are illustrative examples of two nails 110A and 110B that have been incorrectly positioned in the testbed board 102 for testing, as the tips of both nails 110A and 110B are significantly offset from their intended positions. FIG. 2B shows a cross-sectional view of FIG. 2A taken at 2B-2B, which more clearly illustrates that the receptacles 112A and 112B are mounted through the via-holes 212, at slight angles from vertical.

Figure 3:
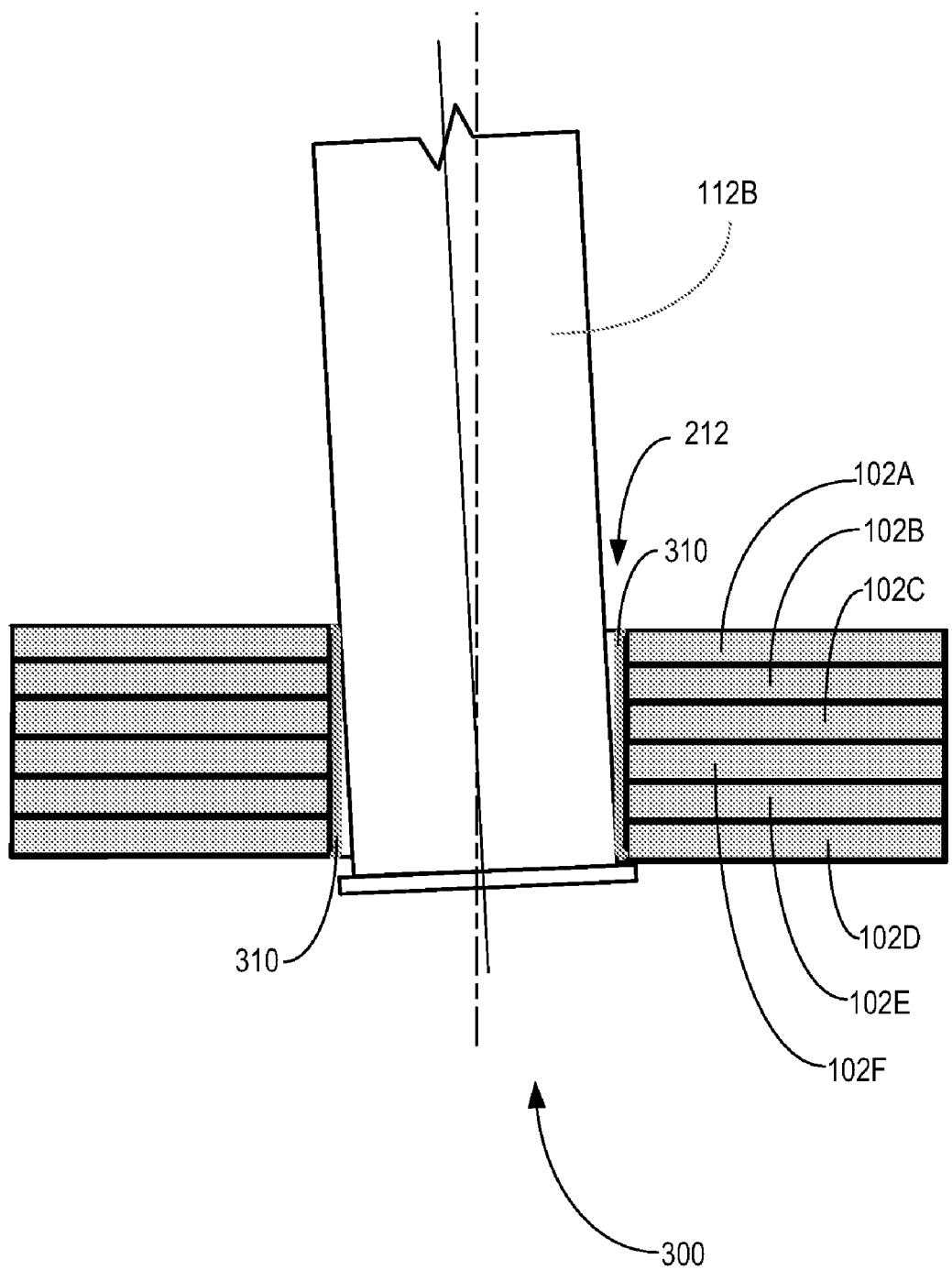
FIG. 3 is an enlarged schematic cross-section of the base of one of the nails of FIGS. 2A & 2B.

FIG. 3 shows in more detail the incorrect positioning of receptacle 112B, in this case due to too much play in the via-hole 212. For example, this may have resulted from not enough copper coating 310 being deposited on the inside surface of the via-hole 212, resulting in the copper coating 310 being too thin for properly positioning the receptacle 112B in the via-hole 212. FIG. 3B also illustrates the individual layers 102A-102F of the testbed board 102 that may be electrically connected by the copper coating 310.

Still referring to FIG. 3, while the angle offset of the receptacle 112B may be slight, the tips of the nails 110A and 110B that must contact the probe points in a DUT (not shown) may be significantly offset from their intended locations for probing the DUT. This may cause inaccurate testing of a DUT placed on the testbed platform 100, resulting in good DUTs being sent back for re-work, or even possibly bad DUTs being accepted and passed through.

If a bad testbed platform 100 is discovered, remedial action that may be taken on the testbed platform 100 often involves difficult resoldering of the nail and receptacle, or complete re-fabrication of the entire testbed platform which may be very expensive.

To address the above identified problems, as will now be explained, the inventors have come up with a new way to mount the receptacles 112 for the nails 110 in the testbed board 102 which significantly improves the accuracy of the positioning of the nails 110 for receiving and probing a DUT.

Figure 4A:
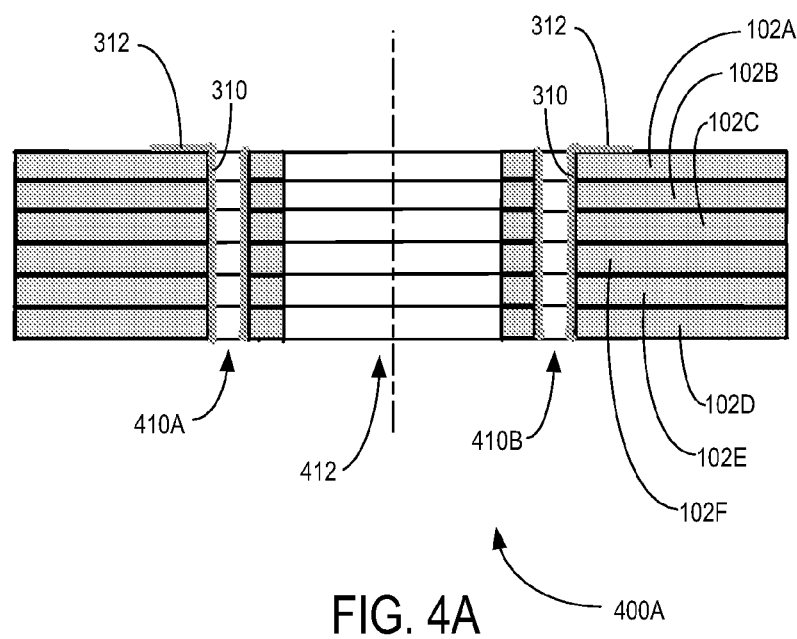
FIG. 4A is a schematic cross-section of an arrangement for positioning and aligning nails in a test bed in accordance with an embodiment.
Figure 4B:
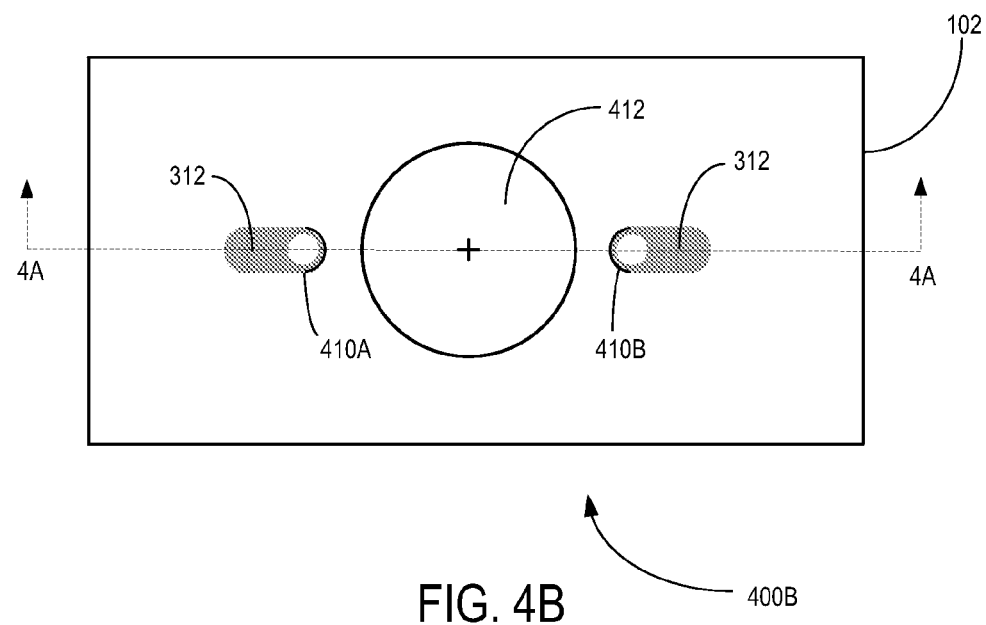
FIG. 4B is a top view of the cross-sectional view of FIG. 4A.

Now referring to FIG. 4A, shown is a cross-sectional view of an arrangement for positioning and aligning nails 110, and receptacles 112 for the nails 110 in a testbed board 102 in accordance with an illustrative embodiment. FIG. 4B shows a corresponding top view of FIG. 4A, with the viewing plane of the cross-sectional view of FIG. 4A shown in FIG. 4B at 4A-4A. As shown, instead of having a via-hole 212 that is drilled with a larger diameter than is required for a receptacle, and which is then coated with copper or other conductive material built up to a suitable thickness, there are now a plurality of holes that serve different functions. More specifically, a mounting through-hole 412 is now provided which is precisely drilled to a suitable diameter for mounting a receptacle 112 substantially perpendicular to the testbed board 102. Now, instead of depositing copper or other conductive material on the walls of through-hole 412 to provide an electrical connection between the layers, one or more adjacent via-holes 410A, 410B are specifically adapted to provide an electrical connection between the layers 102A-102F, using a copper coating 310 or a coating of another suitable conductive material. By way of example, in a typical embodiment, the adjacent via-holes 410A, 410B may be drilled a few millimeters from the through-hole 412 and should be of sufficient distance to ensure mechanical strength of the through-hole 412. The diameter of the via-holes 410A, 410B should be of sufficient size to ensure that an electrical connection can be made reliably through the testbed board 102. Generally speaking, the thicker the testbed board 102, the larger the diameter of the via-holes 410A, 410B need to be to ensure reliable plating.

In an embodiment, drilling may encompass any technique for making a hole that is suitably precise to provide an accurate fit for a receptacle 112 in the mounting through-hole 412, such that the receptacle 112 is substantially perpendicular to the testbed board 102. However, when drilling the testbed board 102 using a drill bit to create the mounting through-hole 412, it is preferable that no conductive plating should be present where the drill will create the mounting through-hole 412. This is because, during the drilling of the mounting through-hole 412, the presence of conductive plating may result in a drill bit possibly destroying the conductive plating, either by lifting the conductive plating off the board, or breaking it up, such that in either case the connection with the opposite-side circuit may be broken.

As the adjacent via-holes 410A and 410B no longer need to receive a receptacle 112, the via-holes 410A and 410B may also be made smaller, and the thickness of the copper coating 310 may vary within a relaxed range of tolerance. Furthermore, the via-holes 410A and 410B need not be drilled all the way through. Instead, each of the via-holes 410A and 410B may be drilled to different depths, if appropriate, to connect certain layers 102A-102F of the testbed board 102, at possibly more than one connection point in each layer.

Also, suitable conductive landing pad extensions 312 may be provided at the location of the via-holes 410A, 410B to provide a suitable location for an electrical connection for the receptacles 112 or nails 110. For example, a receptacle 112 mounted in position in the mounting through-hole 412 may be electrically connected to the conductive landing pad extension 312 using a lead wire and some solder (not shown).

As will be appreciated, by separating the electrical and mechanical functions using multiple holes 410A, 410B, 412, the accuracy in positioning the receptacles 112 (and therefore the nails 110 mounted in place in the receptacles 112), can be greatly improved. That is, the receptacles 112 may be mounted in a substantially perpendicular position relative to the electronic testbed board 102, and without play, such that the nails 110 can be placed more accurately in their intended positions for contacting the probe contact points of a DUT. As well, as it is no longer necessary to control the thickness of the copper 310 as carefully as before, the success rate in manufacturing an accurately functioning testbed platform may also be significantly improved.

Figure 4C:
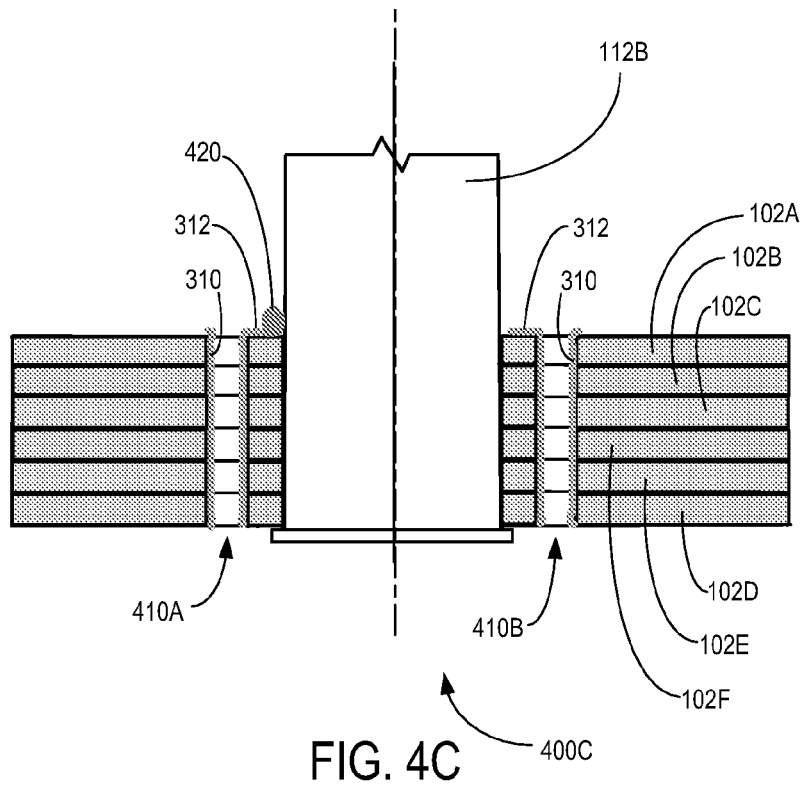
FIG. 4C is the schematic cross-section view of FIG. 4A of an arrangement for electrically connecting receptacles for nails to the testbest in accordance with another embodiment.
Figure 4D:
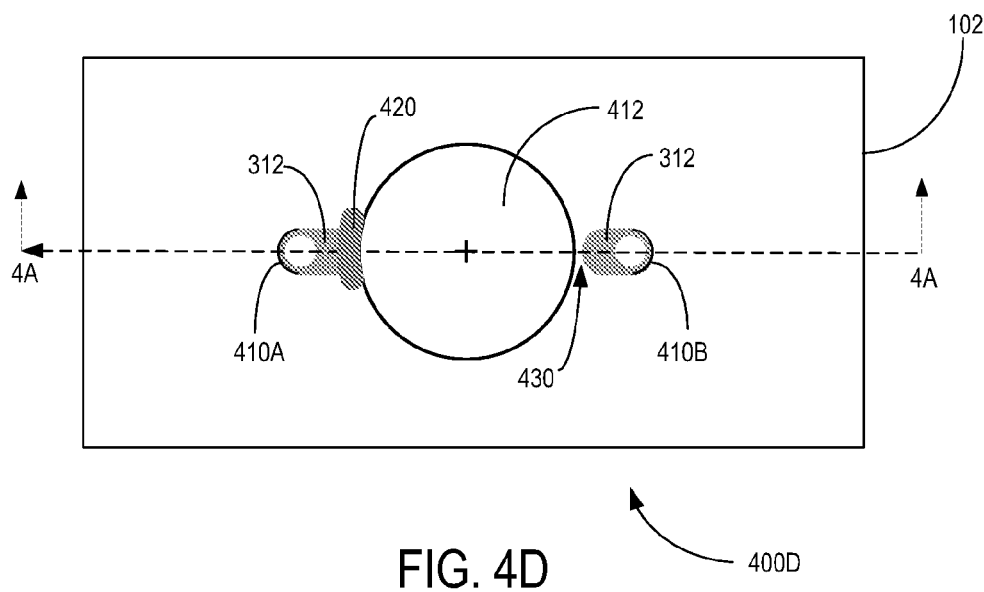
FIG. 4D is a top view of the cross-sectional view of FIG. 4C.

Now referring to FIG. 4C and FIG. 4D, shown is an alternative embodiment for connecting the base of a receptacle (e.g. receptacle 112B) to one or more of the via-holes 410A, 410B. As shown, the conductive landing pad extensions 312 provided at the via-holes 410A, 410B may be positioned towards the mounting through-hole 412. However, to avoid the problem of lifting the copper coating as described earlier, a suitable clearance or gap 430 may be provided between the conductive landing pad extension 312 and the mounting through-hole 412. Once the mounting through-hole 412 has been drilled, and a receptacle 112B has been suitably positioned in the mounting through-hole 412, a bead of solder 420 may be provided to close the clearance 430, thereby providing an electrical connection between the conductive landing pad extension 312 and an exposed base of the receptacle 112B. Therefore, the clearance or gap 430 should be kept to a small distance in order to provide ease of bridging the clearance or gap with the bead of solder 420. It will be appreciated that this way of connecting the receptacle 112B to one or more of the via-holes 410A, 410B avoids having to use a lead wire between the conductive landing pad extension 312 and the receptacle 112B. Also, the additional soldering may provide additional stability to the receptacle 112B mounted in the testbed board 102.

Figure 5:
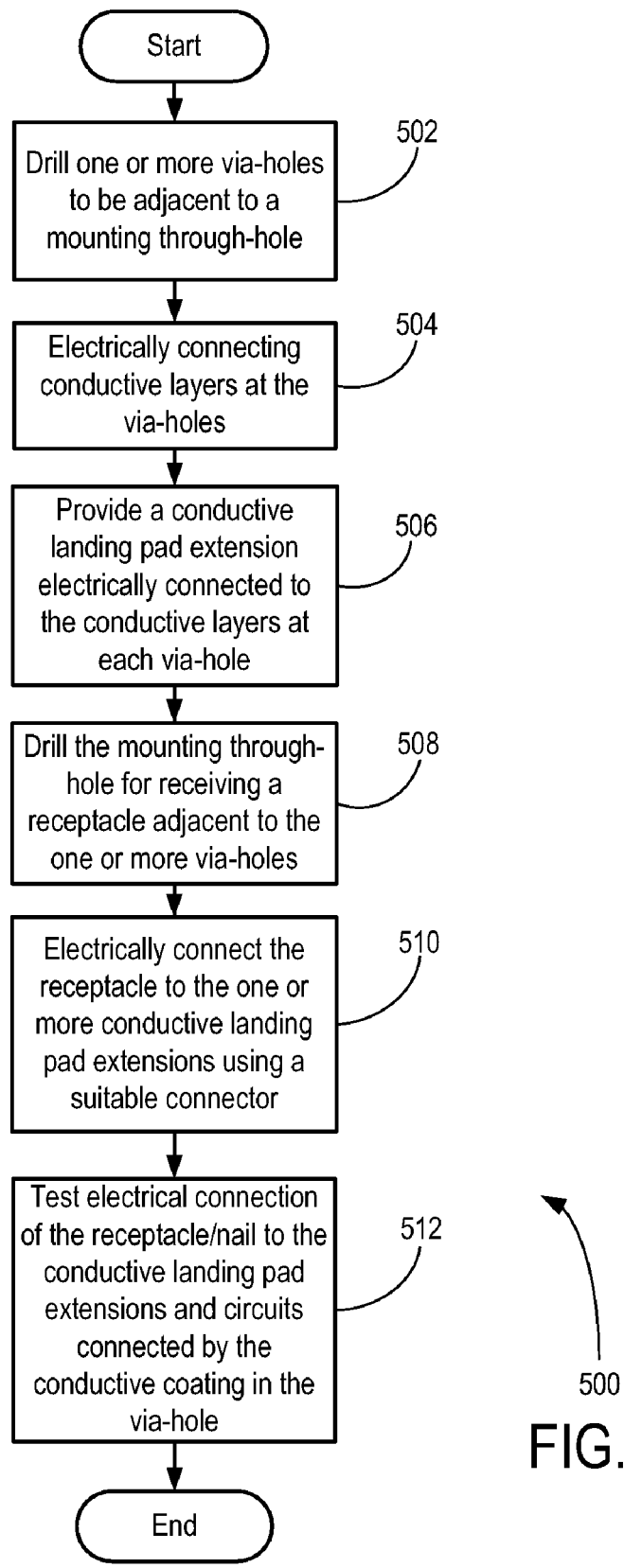
FIG. 5 is a schematic flowchart of a method in accordance with an embodiment.

Now referring to FIG. 5, shown is a flowchart of an illustrative method 500 in accordance with an embodiment. The processes may be, but need not be performed in the order shown in FIG. 5. As shown, method 500 begins and at block 502 drills one or more via-holes to be adjacent to a mounting through-hole.

In an embodiment, the via-holes are drilled before the mounting through-hole is drilled, such that at block 504 method 500 can electrically connect conductive layers at the via-holes. For example, the conductive layers may be electrically connected by coating the inner walls of one or more via-holes with copper or another conductive coating. Alternatively, a solid connector such as a copper insert may be inserted into the via-holes.

Method 500 may then proceed to block 506, where method 500 provides for each via-hole a conductive landing pad extension electrically connected to the conductive layers at each via-hole. As noted earlier, in an embodiment, the conductive landing pads may be positioned towards the mounting through-hole with a suitable clearance.

Method 500 may then proceed to block 508, where method 500 drills the mounting through-hole for receiving a receptacle. As the mounting through-hole need not go through a conductive coating process, the diameter of the mounting through-hole may be drilled more precisely and substantially perpendicular to the testbed board to accommodate the diameter of the receptacle to be mounted in the mounting through-hole.

Method 500 may then proceed to block 510, where method 500 may electrically connect the receptacle to the one or more conductive landing pad extensions using a suitable connector. For example, the suitable connector may be a lead wire that is bonded to the conductive landing pad extension and to the receptacle using solder or an ultrasonic wire bonding machine. Alternatively, if the conductive landing pad extension is properly positioned towards the main thorough hole with a suitable clearance or gap that is provided, solder may be used to bridge the clearance or gap in order to provide an electrical connection between the conductive landing pad extension and a receptacle mounted in the mounting through-hole.

Method 500 may then proceed to block 512, where method 500 may test the electrical connection of the receptacle (and/or the nail spring mounted in the receptacle) to the conductive landing pad extension and any circuits connected by the conductive coating in the via-holes. Method 500 then ends.

Thus, in an aspect, there is provided a method of mounting a receptacle for positioning a nail in an electronic testbed board, comprising: drilling one or more via-holes in the testbed board; electrically connecting conductive layers at the one or more via-holes; and drilling a mounting through-hole for mounting a receptacle adjacent to the one or more via-holes and substantially perpendicular to the testbed board.

In an embodiment, the method further comprises: mounting a receptacle in the mounting through-hole; and electrically connecting the mounted receptacle to the conductive layers at the one or more via-holes.

In an embodiment, electrically connecting the conductive layers at the one or more via-holes comprises applying a conductive coating to the inner walls of the one or more via-holes.

In another embodiment, the method further comprises: providing a conductive landing pad extension at each of the one or more via-holes, the conductive landing pad extension being electrically connected to the conductive layers at the one or more via-holes.

In another embodiment, the method further comprises: mounting a receptacle in the mounting through-hole; and connecting the mounted receptacle to the conductive layers at the one or more via-holes via the landing pad extensions.

In another embodiment, the method further comprises: positioning the conductive landing pad extension at each of the one or more via-holes towards an adjacent mounting through-hole, with a gap provided between the conductive landing pad extension and the mounting through-hole; mounting a receptacle in the mounting through-hole; and connecting the mounted receptacle to the conductive layers at the one or more via-holes by soldering the gap between the landing pad extension and the mounted receptacle.

In another embodiment, drilling one or more via-holes in the testbed board is completed before drilling the mounting through-hole adjacent to the one or more via-holes.

In another embodiment, electrically connecting conductive layers at the one or more via-holes comprises vapour depositing a coating of copper or other conductive material into the one or more via-holes.

In another embodiment, drilling the mounting through-hole is completed before drilling one or more adjacent via-holes in the testbed board.

In another embodiment, electrically connecting conductive layers at the one or more via-holes comprises inserting a copper insert or other conductive material into the one or more via-holes.

In another aspect, there is provided an electronic testbed board for mounting a receptacle for positioning a nail, the electronic testbed board comprising: a mounting through-hole for mounting a receptacle, the mounting through-hole having a suitably precise diameter for mounting the receptacle substantially perpendicular to the testbed board; one or more via-holes located adjacent the mounting through-hole, the one or more via-holes adapted to allow an electrical connection between any conductive layers provided at the one or more via-holes.

In an embodiment, the electrical connection between any conductive layers provided at the one or more via-holes is provided by a coating of copper or other conductive material.

In another embodiment, the electronic testbed board further comprises: a conductive landing pad extension provided at each of the one or more via-holes, the conductive landing pad extensions being electrically connected to the any conductive layers provided at the one or more via-holes.

In another embodiment, the conductive landing pad extensions provided at each of the one or more via-holes are positioned towards the mounting through-hole, with a gap provided between the conductive landing pad extensions and the mounting through-hole.

In another embodiment, the electronic testbed board further comprises: a receptacle mounted in the mounting through-hole; and an electrical conductor closing the gap provided between the conductive landing pad extensions and the receptacle mounted in the mounting through-hole.

In another embodiment, the electrical conductor is a bead of solder electrically connecting the conductive landing pad extensions to an exposed base of the receptacle mounted in the mounting through-hole.

In another embodiment, the mounting through-hole for mounting a receptacle is formed by mechanical drilling with a drill bit.

In another embodiment, the diameter of the mounting through-hole for mounting a receptacle is drilled to a suitably precise diameter for mounting the receptacle without play.

In another aspect, there is provided an electronic testbed, comprising: at least one nail in a receptacle mounted in a mounting through-hole in the electronic testbed board, the mounting through-hole adapted to mount the receptacle in a substantially perpendicular position relative to the electronic testbed; one or more via-holes adjacent the at least one nail in a receptacle mounted in the mounting through-hole, the one or more via-holes adapted to electrically connect any conductive layers at the one or more via-holes; and an electrical connection provided between any conductive layers at the one or more via-holes and the at least one nail in a receptacle mounted in the mounting through-hole.

While illustrative embodiments have been described above, it will be appreciated that various changes and modifications may be made. More generally, the scope of the invention is defined by the following claims.

What is claimed is:

1. An electronic testbed board for mounting a receptacle for positioning a nail, the electronic testbed board comprising:
   a mounting through-hole provided in the testbed board for mechanically mounting a receptacle in the testbed board, the mounting through-hole having a suitably precise diameter for mounting the receptacle substantially perpendicular to the testbed board;

one or more via-holes provided in the testbed board and located adjacent to the mounting through-hole, the one or more via-holes adapted to allow an electrical connection, via a coating of conductive material or a conductive insert, between any conductive layers provided in the testbed board at the one or more via-holes, wherein the one or more via-holes are exposed.

2. The electronic testbed board of independent claim 1, further comprising:

a conductive landing pad extension provided at each of the one or more via-holes, the conductive landing pad extensions being electrically connected to the any conductive layers provided at the one or more via-holes.

3. The electronic testbed board of claim 2, wherein the conductive landing pad extensions provided at each of the one or more via-holes are positioned towards the mounting through-hole, with a gap provided between the conductive landing pad extensions and the mounting through-hole.

4. The electronic testbed board of claim 3, further comprising:

a receptacle mounted in the mounting through-hole; and an electrical conductor closing the gap provided between the conductive landing pad extensions and the receptacle mounted in the mounting through-hole.

5. The electronic testbed board of claim 4, wherein the electrical conductor is a bead of solder electrically connecting the conductive landing pad extensions to an exposed base of the receptacle mounted in the mounting through-hole.

6. The electronic testbed board of independent claim 1, wherein the mounting through-hole for mounting a receptacle is formed by mechanical drilling with a drill bit.

7. The electronic testbed board of claim 6, wherein the diameter of the mounting through-hole for mounting a receptacle is drilled to a suitably precise diameter for mounting the receptacle without play.

8. An electronic testbed board for testing electronic circuits, the electronic testbed board comprising:

a receptacle having a nail coupled thereto, the nail configured to couple a test electronic circuit to the receptacle;

a mounting through-hole provided in the electronic testbed board for mechanically mounting the receptacle in the testbed board, the mounting through-hole having a diameter substantially the same as the outer diameter of the receptacle so that the receptacle when received in the mounting through-hole is substantially perpendicular to the testbed board;

one or more exposed via-holes provided in the testbed board and located adjacent to the mounting through-hole, the one or more via-holes comprising one of a conductive insert and or a coating of conductive material substantially lining the one or more via-holes so that one or more conductive layers of the testbed board are in electrical contact with at least one other conductive layer; and the one or more via-holes adapted to allow an electrical connection, via a coating of conductive material or a conductive insert, between any conductive layers provided in the testbed board at the one or more via-holes, wherein the one or more via-holes are exposed.

\* \* \* \* \*